(12) United States Patent
Sathe et al.

(10) Patent No.: US 7,589,395 B2
(45) Date of Patent: Sep. 15, 2009

(54) MULTIPLE-DICE PACKAGES USING ELEMENTS BETWEEN DICE TO CONTROL APPLICATION OF UNDERFILL MATERIAL TO REDUCE VOID FORMATION

(75) Inventors: Ajit V. Sathe, Chandler, AZ (US); Mathew J. Manusharow, Phoenix, AZ (US); Sung-Won Moon, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 11/428,250

(22) Filed: Jun. 30, 2006

(65) Prior Publication Data
US 2008/0001310 A1   Jan. 3, 2008

(51) Int. Cl.
   *H01L 23/544* (2006.01)
(52) U.S. Cl. ............ 257/620; 257/724; 257/725
(58) Field of Classification Search ......... 257/787–795, 257/620, 724, 725
   See application file for complete search history.

(56) References Cited

U.S. PATENT DOCUMENTS

| | | | |
|---|---|---|---|
| 5,504,373 A * | 4/1996 | Oh et al. ............ | 257/734 |
| 5,856,937 A * | 1/1999 | Chu et al. ............ | 365/51 |
| 6,147,876 A * | 11/2000 | Yamaguchi et al. ......... | 361/766 |
| 6,750,536 B2 * | 6/2004 | Stewart ................ | 257/691 |
| 7,098,542 B1 * | 8/2006 | Hoang et al. ........... | 257/778 |
| 7,291,543 B2 * | 11/2007 | Grigg et al. ........... | 438/459 |
| 7,442,643 B2 * | 10/2008 | Wood et al. ........... | 438/681 |
| 7,452,750 B2 * | 11/2008 | Lo et al. ............. | 438/108 |
| 7,488,618 B2 * | 2/2009 | Wood et al. ........... | 438/72 |
| 2002/0089833 A1 * | 7/2002 | Patel et al. ........... | 361/760 |
| 2004/0241914 A1 * | 12/2004 | Baldwin .............. | 438/126 |
| 2007/0152326 A1 * | 7/2007 | Lim et al. ............. | 257/723 |

* cited by examiner

*Primary Examiner*—Thao P. Le
(74) *Attorney, Agent, or Firm*—Schwegman, Lundberg & Woessner, P.A.

(57) ABSTRACT

Application of underfill material may be controlled to minimize the formation of voids between a plurality of integrated circuit ("IC") dice and a substrate in an IC package. One or more elements are located in a gap between two dice to control the flow of underfill material and minimize the formation of voids within the underfill material. In an embodiment, an element may be an active electrical component, a passive electrical component, or a non-functional electrical component. Methods of fabrication, as well as application of the package to an electronic assembly and to an electronic system, are also described.

18 Claims, 9 Drawing Sheets

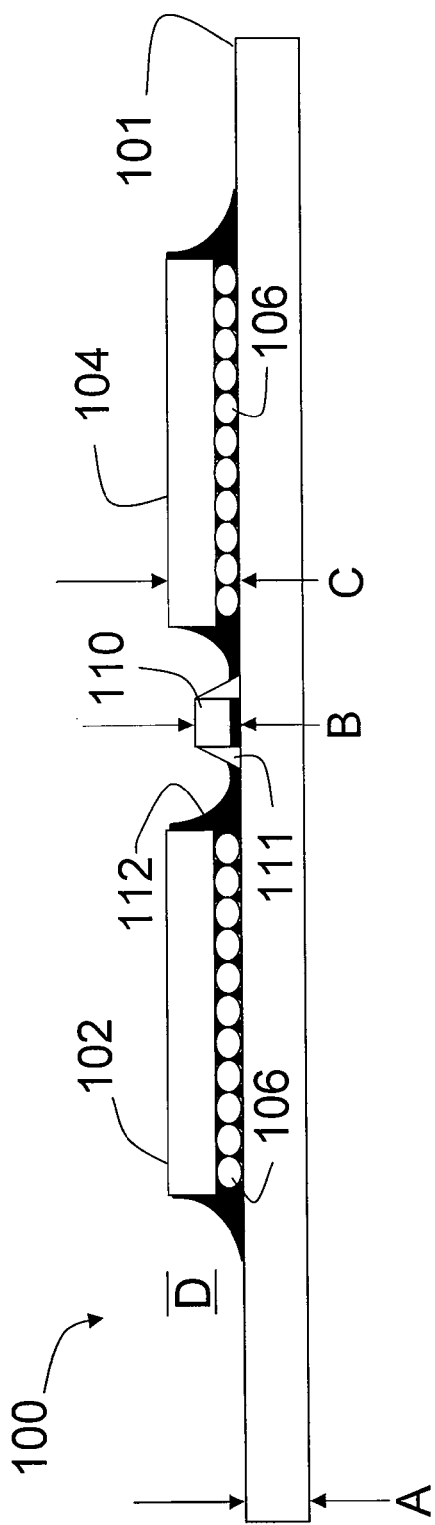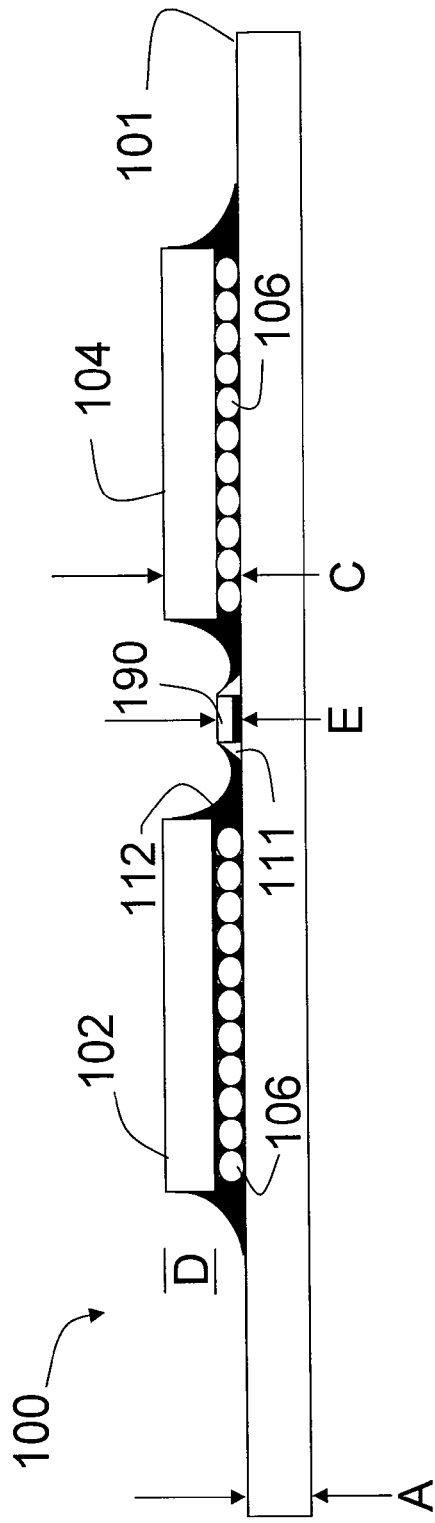

MULTIPLE-DICE PACKAGES USING ELEMENTS BETWEEN DICE TO CONTROL APPLICATION OF UNDERFILL MATERIAL TO REDUCE VOID FORMATION

TECHNICAL FIELD

The subject matter relates generally to electronics packaging and, more particularly, to an electronics package with controlled underfill distribution between two or more components and a substrate to which the components are mounted, and to manufacturing methods related thereto.

BACKGROUND INFORMATION

One or more integrated circuits ("IC") dice may be assembled into an IC package by physically and electrically coupling them to a substrate made of organic or ceramic material. One or more IC packages may be physically and electrically coupled to a printed circuit board ("PCB") to form an "electronic assembly". The "electronic assembly" may be part of an "electronic system". An "electronic system" is broadly defined herein as any product comprising an "electronic assembly". Examples of electronic systems include computers (e.g., server, router, desktop, laptop, hand-held, Web appliance, etc.), wireless communications devices (e.g., cellular phone, cordless phone, pager, etc.), computer-related peripherals (e.g., printer, scanner, monitor, etc.), entertainment devices (e.g., television, radio, stereo, tape and compact disc players, video cassette recorder, camcorder, digital camera, MP3 (Motion Picture Experts Group, Audio Layer 3) player, etc.), and the like.

An IC package may comprise one or more IC dice. At least one surface of a die may comprise a number of pads or contacts to couple the die functionally to another element, such as an IC substrate. An underfill material may be used to surround those contacts in order to improve long-term reliability by mechanically coupling the IC die to the substrate and by sealing the IC die against contaminants.

An IC substrate may have a relatively large number of input/output ("I/O") terminals (also called "lands"), as well as a large number of power and ground terminals or lands, on a surface of the IC substrate.

In the field of electronics there is competitive pressure among manufacturers to drive the performance of their equipment up while driving down production costs and maintaining acceptable yield and reliability. This is particularly true regarding the packaging of dice on substrates, where each new generation of packaging must provide increased performance, particularly in terms of higher clock frequencies, while generally being smaller or more compact in size.

In an IC package that comprises two or more IC dice, there is a likelihood that one or more voids may form within underfill material that is applied between the dice and the IC substrate. A void within the underfill material may adversely affect the long-term reliability of the IC package by weakening the mechanical bond between one or more of the IC dice and the substrate, and/or by allowing contaminants to damage the connections between the dice and the substrate.

BRIEF DESCRIPTION OF THE DRAWINGS

FIG. 9 shows a cross-sectional view taken along line 132 of FIG. 3;

FIG. 11 shows a cross-sectional view taken along line 134 of FIG. 3 of an IC package comprising an element 130 that has a lower height above the upper surface of the substrate than that of a corresponding element 110 in FIG. 9.

DETAILED DESCRIPTION

In the following detailed description of embodiments of the subject matter, reference is made to the accompanying drawings, which form a part hereof, and in which is shown by way of illustration specific preferred embodiments in which the subject matter may be practiced. These embodiments are described in sufficient detail to enable those skilled in the art to practice the subject matter, and it is to be understood that other embodiments may be utilized and that structural, mechanical, compositional, electrical, and procedural changes may be made without departing from the spirit and scope of the subject matter. The following detailed description is, therefore, not to be taken in a limiting sense, and the scope of the subject matter is defined only by the appended claims.

The subject matter may provide a solution to certain underfill distribution problems that are associated with prior art packaging of IC's. In an embodiment, the application of underfill material is controlled by a physical arrangement of elements to minimize formation of voids between the dice and substrate. The elements may vary in their dimensions, placement, and orientation on the substrate. The elements may be electrical components, including active electrical components, and passive electrical components, such as capacitors or the like. Various embodiments are illustrated and described herein, including methods of fabrication, as well as application of an IC package to an electronic assembly and to an electronic system.

Figure 1:
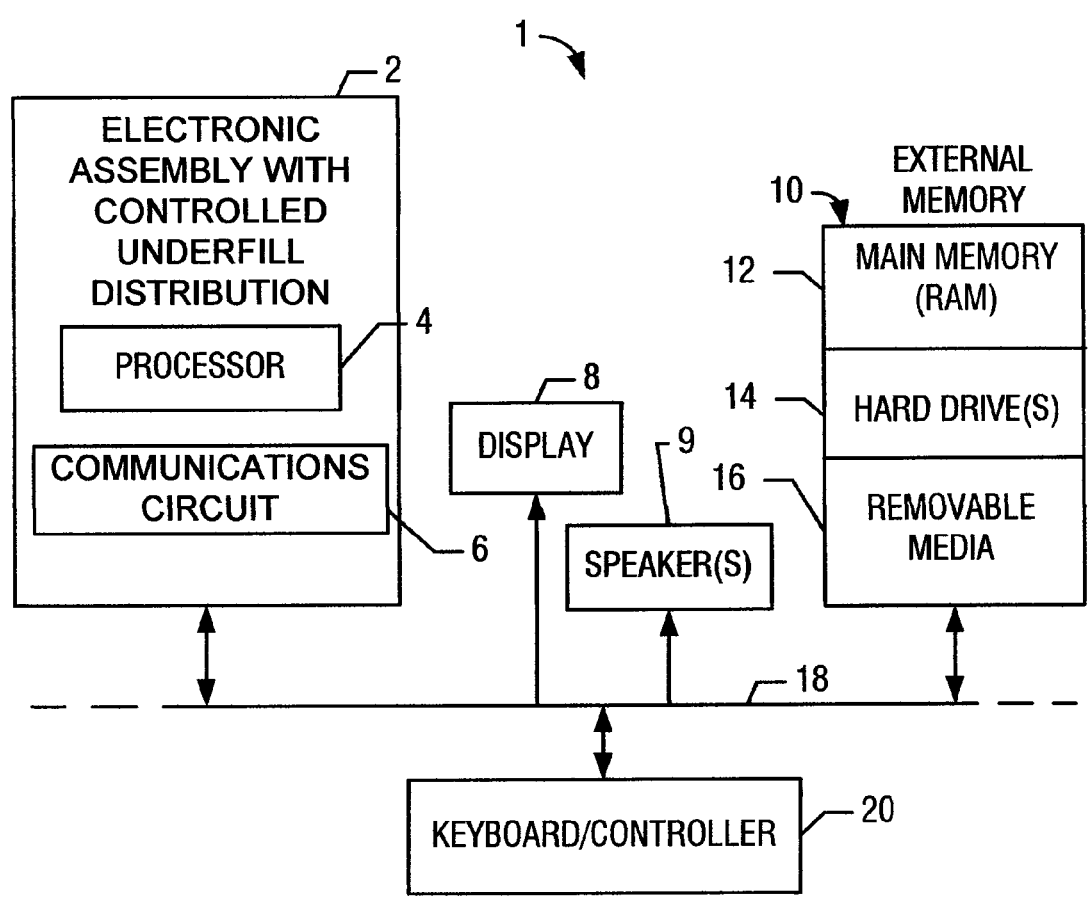
FIG. 1 is a block diagram of an electronic system incorporating at least one electronic assembly with controlled underfill distribution, in accordance with an embodiment of the subject matter.

FIG. 1 is a block diagram of an electronic system 1 incorporating at least one electronic assembly 2 with controlled underfill distribution, in accordance with an embodiment of the subject matter. Electronic system 1 is merely one example of an electronic system in which the subject matter may be used. In this example, electronic system 1 comprises a data processing system that includes a system bus 18 to couple various components of the system. System bus 18 provides communications links among various components of the electronic system 1 and may be implemented as a single bus, as a combination of busses, or in any other suitable manner.

"Suitable", as used herein, means having characteristics that are sufficient to produce the desired result(s). Suitability for the intended purpose can be determined by one of ordinary skill in the art using only routine experimentation.

Electronic assembly 2 is coupled to system bus 18. Electronic assembly 2 may include any circuit or combination of circuits. In an embodiment, electronic assembly 2 includes at least one processor 4 which may be of any type. In another embodiment, two or more processors 4 are included. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that may be included in electronic assembly 2 are a custom circuit, an application-specific integrated circuit (ASIC), or the like, such as, for example, one or more circuits (such as a communications circuit 6) for use in wireless devices like cellular telephones, pagers, portable computers, personal digital assistants, two-way radios, and similar electronic systems. The IC's may perform any other type of function.

Electronic system 1 may also include an external memory 10, which in turn may include one or more memory elements suitable to the particular application, such as a main memory 12 in the form of random access memory (RAM), one or more hard drives 14, and/or one or more drives that handle removable media 16 such as floppy diskettes, compact disks (CDs), digital video disks (DVD), and the like.

Electronic system 1 may also include a display device 8, one or more speakers 9, and a keyboard and/or controller 20, which may include a mouse, trackball, game controller, voice-recognition device, or any other device that may permit a system user to input information into and receive information from the electronic system 1.

An electronic system 1 and/or data processing system that incorporates one or more electronic assemblies 2 that utilize an embodiment of the subject matter may minimize formation of underfill voids associated with high performance multiple-dice IC packages, and such systems may therefore be more reliable and more commercially attractive than other systems.

Figure 2:
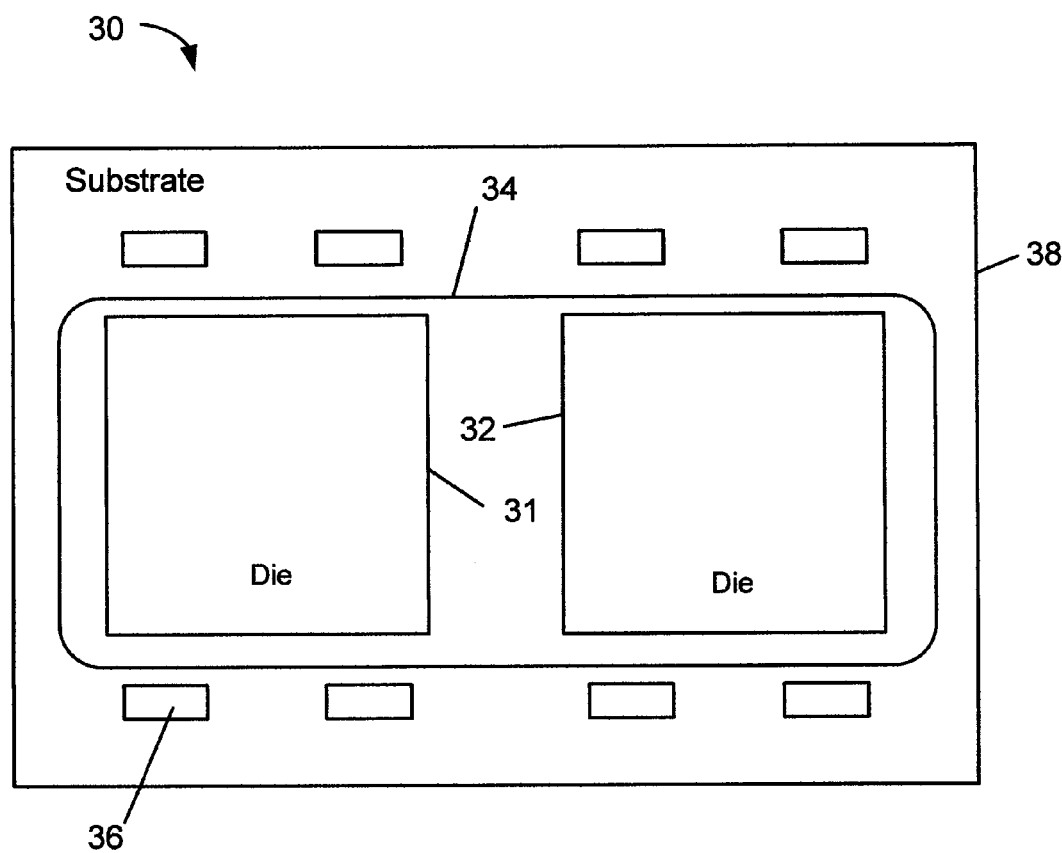
FIG. 2 illustrates a top view representation of a prior art IC package.

FIG. 2 illustrates a top view representation of a prior art IC package 30. Prior art IC package 30 includes a substrate 38 and a pair of dice 31 and 32. Some prior art packages may contain more than two IC dice. One or more capacitors 36 may be arranged in the area between dice 31, 32 and the upper and lower edges of substrate 38, as viewed in FIG. 2, which may also be referred to herein as the "north" and "south" edges, respectively. An underfill material 34 surrounds IC dice 31 and 32. The underfill material 34 is also located in the region underlying IC dice 31 and 32, between IC dice 31 and 32 and the substrate 38. The underfill material 34 mechanically bonds the IC dice 31 and 32 to the substrate 38. Underfill material 34 also serves to encapsulate the contacts (not shown) that connect IC dice 31 and 32 to the substrate 38. FIG. 2 shows underfill material 34 after it has been applied and cured, forming a hardened or congealed underfill.

The structure of the prior art IC package 30 may give rise to problems with underfill distribution, as will be seen in FIG. 7, to be described later. In the prior art IC package 30, underfill application may leave voids in the cured underfill material 34 in the region underlying IC dice 31 and 32, i.e., between the die 31 or 32 and the substrate 38.

Figure 3:
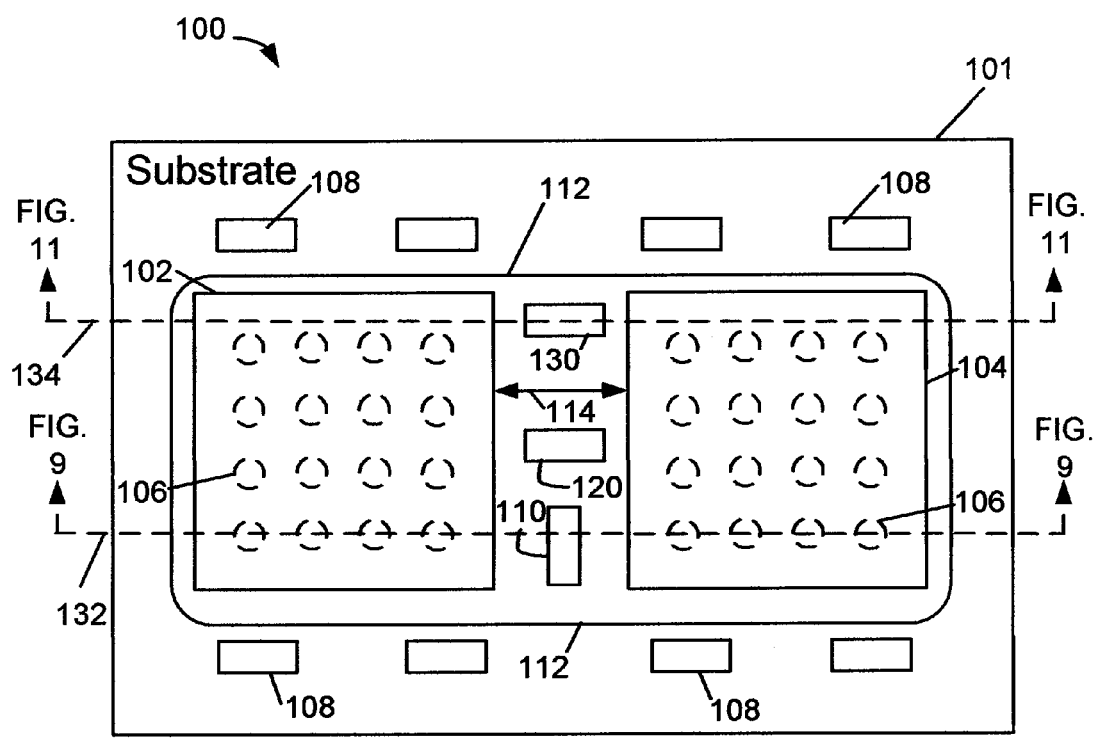
FIG. 3 illustrates a top view representation of a controlled underfill distribution IC package, in accordance with an embodiment of the invention.

FIG. 3 illustrates a top view representation of a controlled underfill distribution IC package 100, in accordance with an embodiment of the invention.

IC package 100 includes a substrate 101 upon which may be mounted a first IC 102 and a second IC 104. IC 102 may be of a first type, such as a processor. IC 104 may be of the first type, or it may be of a second type, such as any suitable electronic component.

Substrate 101 may be a one-layer board or a multi-layer board, and it may include lands (not shown) on its lower surface for mating with additional packaging structure (not shown). Substrate 101 may also comprise a number of conductors (not shown), such as traces, ground planes, and vias of any type. The conductors may be for signals, for power, and for ground.

IC dice 102 and 104 are shown mounted in a "flip-chip" orientation, with connections, such as solder bumps or balls 106 (shown in dashed outline), coupling IC dice 102 and 104 to the substrate 101. Although IC's 102 and 104 are shown in FIG. 3 as rectangles having similar dimensions, each IC may have any suitable shape or dimension. In an embodiment, IC 104 may be of a different dimension than IC 102, and/or it may be arranged on the substrate in a staggered fashion relative to IC 102.

IC dice 102 and 104 are separated by a gap 114. In an embodiment, the sides of IC dice 102 and 104 that are separated by the gap 114 may be parallel. In other embodiments, the sides of IC dice 102 and 104 that are separated by the gap 114 may converge, resulting in a gap 114 of non-uniform width. The dimensions of gap 114 may vary in accordance with the dimensions of IC dice 102 and 104.

A suitable underfill material 112 surrounds the connections 106 in the region underlying IC dice 102 and 104, between the IC dice 102 and 104 and the substrate 101. The perimeter of the underfill material 112 is shown in FIG. 3 as being evenly spaced away from the edges of IC dice 102 and 104. However, because underfill material 112 is typically dispensed along one side of IC package 101, such as the lower side of the IC package 101 shown in FIG. 3, and due to certain properties of the underfill material, one IC die may receive greater underfill coverage than the other, resulting in a perimeter that may not be evenly spaced away from the edges of the IC dice. In an embodiment, the perimeter of underfill material 112 may vary in its distance from the edges of IC dice 102 and 104, and it may extend to a greater distance on one side of the IC dice than the other. For example, assuming underfill material 112 is dispensed from the lower side of IC package 101, underfill material 112 may have a wider coverage margin along the lower edges of IC's 102 and 104 than along the upper edges of IC's 102 and 104.

The perimeter of the underfill material 112 may be of any shape, so long as the underfill material 112 within the perimeter properly surrounds or encapsulates the connections between the IC dice 102, 104 and the substrate 101. The underfill material 112 may be any suitable type of non-conductive material that hardens or congeals after application, with or without the application of heat. In an embodiment, the underfill material 112 may be a thermosetting epoxy.

In an embodiment, one or more elements 108, 110, 120, and 130 may be coupled to substrate 101. For example, one or more elements 108 may be coupled to the substrate 101 in a region around the periphery of IC's 102, 104 but outside of the gap 114 between IC's 102 and 104. In FIG. 3, elements 108 are shown outside the perimeter of underfill material 112.

However, in other embodiments, portions of elements 108 may be partially or completely surrounded by the underfill material 112. Elements 108 may be active or passive components. In an embodiment, elements 108 may be capacitors, such as die-side capacitors. In another embodiment, elements 108 are not present.

One or more elements, such as elements 110, 120, and 130, are located in gap 114 between IC dice 102 and 104. Although three elements 110, 120, and 130 are illustrated in FIG. 3, more or fewer than three elements could be used. Although elements 110, 120, and 130 are shown as substantially identical in dimensions and shape, they may be of different dimensions and shapes.

Further, elements 110, 120, and 130 may be oriented in any suitable manner within gap 114. In an embodiment, at least one of the elements (e.g., elements 120, 130) may be oriented so that its length extends between the opposing IC dice 102 and 104. In an alternate embodiment, at least one of the elements (e.g., element 110) may be oriented so that its width extends between the opposing IC dice 102 and 104. Elements 110, 120, and 130 may be arranged symmetrically or asymmetrically with respect to each other. Elements 110, 120, and 130 may be arranged orthogonally or non-orthogonally with respect to either or both of the IC dice 102 and 103. The elements in gap 114 may be placed side-by-side in one or more rows and/or columns.

Elements 110, 120, and 130 may have a height that is at least 5% of the height of one of the IC dice 102 and 104. In an embodiment, elements 110, 120, and 130 have a height that is between 50% and 75% of the height of one of the IC dice 102 and 104. In an embodiment, elements 110, 120, and 130 have a height that is approximately 70% of the height of one of the IC dice 102 and 104. In other embodiments, the height of elements 110, 120, and 130 may be up to or greater than 100% of the height of one of the IC dice 102 and 104. In an embodiment, the elements 110, 120, and 130 have a width at least 5% of the width of gap 114. In an embodiment, the elements 110, 120, and 130 have a width in the range of 5-95% of the width of gap 114.

Elements 110, 120, and 130 may be any component(s) suitable for placing within the gap 114 to control underfill material 112 flow during application. In an embodiment, elements 110, 120, and 130 may be active or passive components, or a combination thereof. In an embodiment, elements 110, 120, and 130 may be capacitors. In an embodiment wherein elements 110, 120, and 130 are capacitors, they may range between 0.4 millimeters ("mm") and 0.7 mm in thickness. In other embodiments, the thickness of elements 110, 120, and 130 may be greater or less than this range.

In an alternate embodiment, elements 110, 120, and 130 may be electrically neutral or dummy components serving no electrical or electronic function. In an embodiment, elements 110, 120, and 130 may be a combination of active, passive, and electrically neutral components.

In an embodiment, the thickness of IC dice 102 and 104 is approximately 0.79 mm, but in other embodiments the thickness may be greater or less than this. In an embodiment, the thickness of substrate 101 is in a range of approximately 1.0 mm to 1.4 mm, but in other embodiments the thickness may be greater or less than this.

Although the embodiment shown in FIG. 3 has been described with reference to two IC dice 102 and 104, embodiments of the subject matter are not limited to controlling underfill distribution under only two IC dice, and they may be used for controlling underfill distribution under more than two IC dice.

Figure 4:
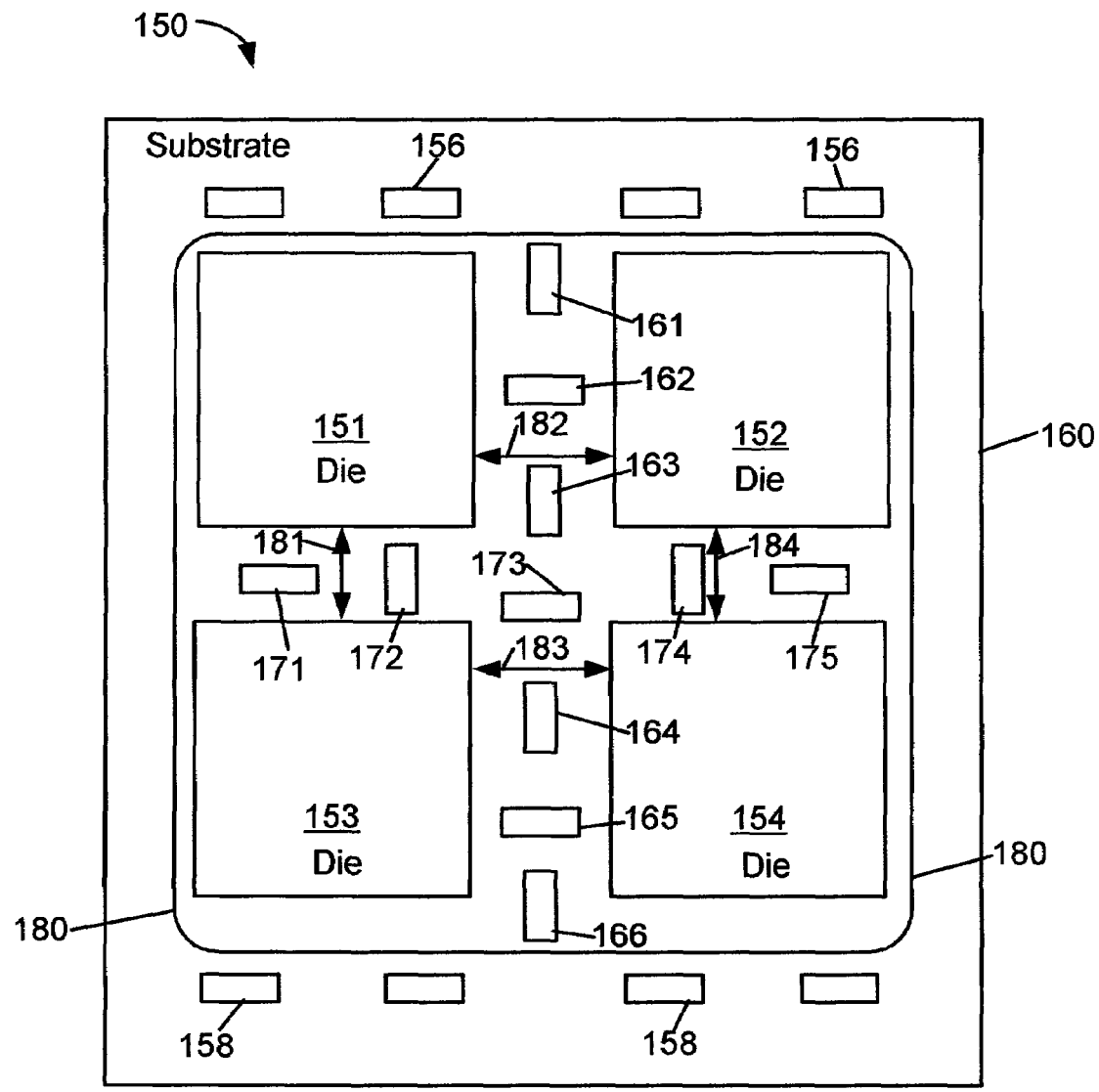
FIG. 4 illustrates a top view representation of a controlled underfill distribution IC package, in accordance with another embodiment of the invention.

FIG. 4 illustrates a top view representation of a controlled underfill distribution IC package 150, in accordance with another embodiment of the invention. IC package 150 includes a substrate 160 upon which may be mounted a first IC 151, a second IC 152, a third IC 153, and a fourth IC 154. Substrate 160 may be identical or similar to the substrate 101 described in FIG. 3.

IC dice 151-154 may be identical or similar to the IC dice 102, 104 described in FIG. 3. One or more of IC dice 151-154 may be a processor. In an embodiment, IC dice 151-154 may all be of one type, or they may be of two or more different types. In an embodiment, the four IC dice 151-154 may be arranged in a "two-up, two-down" (matrix) configuration with an even number of dice in each row as shown in FIG. 4. In an alternative embodiment, each row may comprise even and/or odd numbers of IC dice. In the configuration shown in FIG. 4, the edges of two adjacent IC dice are approximately parallel. In an alternative embodiment, the dice 151-154 may be arranged such that an edge of one or more IC dice is not parallel to an edge of any other IC die. The dimensions and arrangement of IC dice 151-154 determine the dimensions of gaps 181-184; therefore, any arrangement of IC dice 151-154 that results in suitable gaps 181-184 may be used.

IC dice 151 and 153 are separated by gap 181; IC dice 151 and 152 are separated by gap 182; IC dice 152 and 154 are separated by gap 184; and IC dice 154 and 153 are separated by gap 183. Gaps 181-184 may be identical or similar to the gap 114 described in FIG. 3. Gaps 181-184 may have identical or similar dimensions, as shown in FIG. 4. However, in an embodiment, one or more of the gaps 181-184 may have a different dimension than the other gaps 181-184. In an embodiment, gaps 181 and 184 may be of similar width. In an alternative embodiment, gaps 181 and 182 may be of similar width.

In an embodiment, one or more elements 156 and 158 may be coupled to substrate 160. Elements 156 and 158 may be identical or similar to the elements 108 described in FIG. 3. In an embodiment, elements 156 and 158 may be capacitors. In an embodiment, elements 156 and 158 are not present.

One or more elements, such as elements 161-163, may be located in gap 182. One or more elements, such as elements 164-166, may be located in gap 183. One or more elements, such as elements 171 and 172, may be located in gap 181. Likewise, one or more elements, such as elements 174 and 175, may be located in gap 184. The elements 161-166 and 171-175 may be identical or similar to the elements 110, 120, and 130 described in FIG. 3. Although elements 161-166 and elements 171-175 are shown as substantially identical in dimensions and shape, they may be of different dimensions and shapes. Although three elements 161, 162, and 163 are illustrated in gap 182 of FIG. 4, more or fewer than three elements could be used.

Elements 161-163 may be oriented in any suitable manner within gap 182. In an embodiment, at least one of the elements (e.g., element 162) may be oriented so that its length extends between the opposing IC dice 151 and 152. In the same or in an alternate embodiment, at least one of the elements (e.g., element 161 or 163) may be oriented so that its width extends between the opposing IC dice 151 and 152. In an embodiment, elements 161-163 are oriented in two or more different orientations.

Elements 164-166 in gap 183 may be identical or similar to elements 161-163. Elements 171-175 may be identical or similar to elements 161-163. Further, elements 171-175 may be of any suitable dimension, shape, and function, and they may be placed in any suitable orientation.

A suitable underfill material 180 surrounds the IC dice 151-154 and the elements 161-166 and 171-174 within gaps 181-184. The underfill material 180 may be identical or similar to the underfill material 112 described in FIG. 3. Underfill 180 also surrounds the connections (not shown) in the regions underlying IC dice 151-154, between the IC dice 151-154 and the substrate 160.

Although the embodiment shown in FIG. 4 has been described with reference to four IC dice 151-154, embodiments of the subject matter are not limited to only four IC dice, and they may be used to control underfill distribution under fewer than or more than four IC dice.

Figure 5:
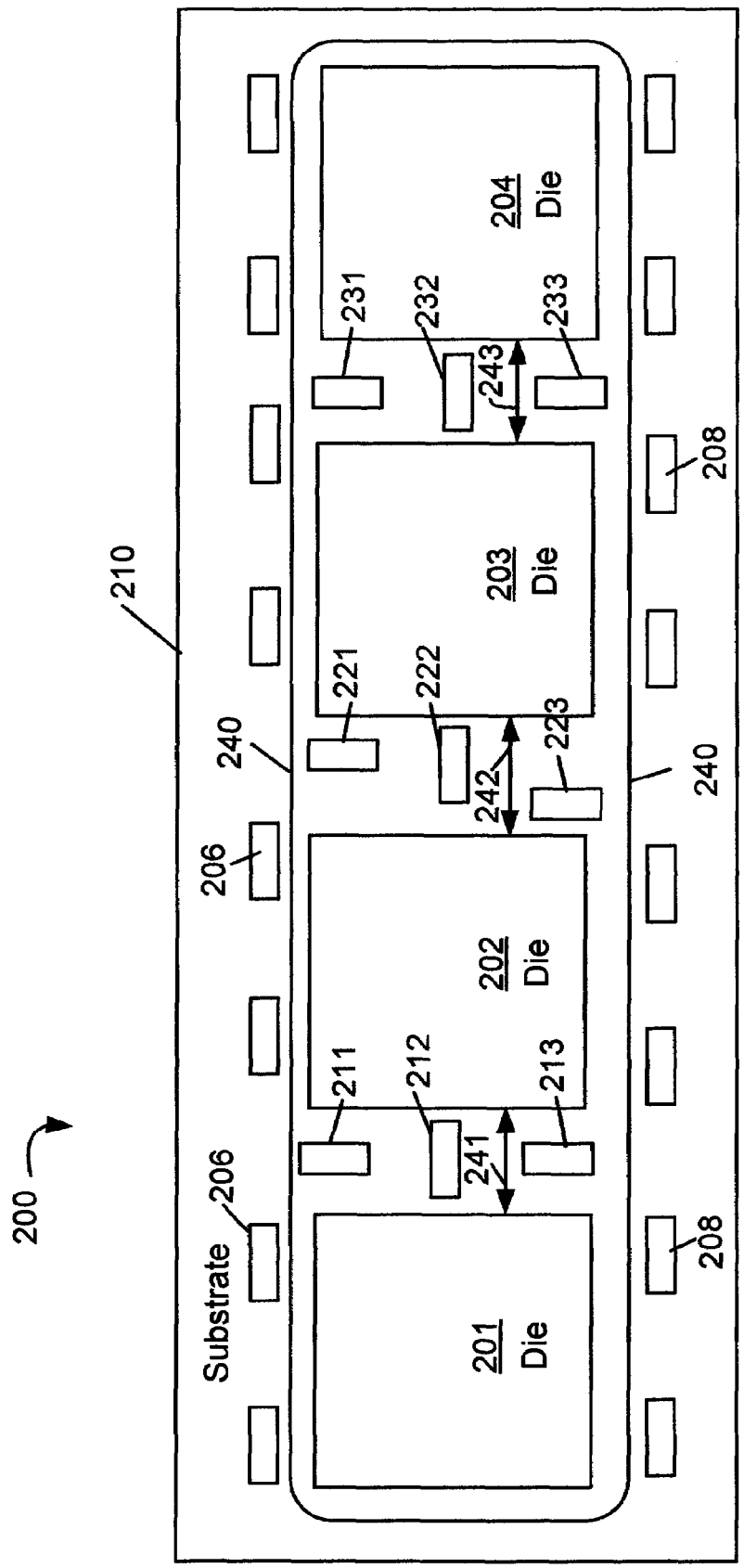
FIG. 5 illustrates a top view representation of a controlled underfill distribution IC package, in accordance with another embodiment of the invention.

FIG. 5 illustrates a top view representation of a controlled underfill distribution IC package 200, in accordance with another embodiment of the invention. IC package 200 includes four IC dice 201-204 arranged on a substrate 210. Substrate 210 may be identical or similar to the substrate 101 described in FIG. 3.

IC dice 201-204 may be identical or similar to the IC dice 102, 104 described in FIG. 3. In an embodiment, the four IC dice 201-204 may be arranged in an approximately linear configuration as shown in FIG. 5. In an alternative embodiment, the dice 201-204 may be arranged in a single row, but with one or more dice staggered out of linear alignment. In the configuration shown in FIG. 5, the edges of two adjacent IC dice are approximately parallel. In an alternative embodiment, the dice 201-204 may be arranged such that an edge of one or more IC dice is not parallel to an edge of any other IC die. IC dice 201 and 202 are separated by gap 241, which may be identical or similar to the gap 114 described in FIG. 3.

IC dice 202 and 203 are separated by gap 242, which may be identical or similar to the gap 114 described in FIG. 3.

IC dice 203 and 204 are separated by gap 243, which may be identical or similar to the gap 114 described in FIG. 3.

The dimensions and arrangement of IC dice 201-204 determine the dimensions of gaps 241-243. Therefore, any arrangement of IC dice 201-204 that results in suitable gaps 241-243 may be used.

A suitable underfill material 240 surrounds the connections (not shown) in the regions underlying IC dice 201-204, between the IC dice 201-204 and the substrate 210. The underfill material 240 may be identical or similar to the underfill material described in FIG. 3.

In an embodiment, one or more elements 206 and 208 may be coupled to substrate 210. Elements 206 and 208 may be identical or similar to the elements 108 described in FIG. 3.

One or more elements, such as elements 211, 212, and 213, are located in the gap 241 between IC dice 201 and 202. Elements 211, 212, and 213 may be identical or similar to the elements 110, 120, and 130 described in FIG. 3. Although three elements 211, 212, and 213 are illustrated within gap 241 in FIG. 5, more or fewer than three elements could be used. In an embodiment, some portion of elements 211, 212, and 213 may extend beyond the north or south boundaries of gap 241, as the illustration of element 211 shows.

Further, elements 211, 212, and 213 may be oriented in any suitable manner within gap 241. The orientation of elements 211, 212, and 213 may be identical or similar to the orientation of the elements 110, 120, and 130 described in FIG. 3.

One or more elements, such as elements 221, 222, and 223, are located in the gap 242 between IC dice 202 and 203. Elements 221, 222, and 223 may be identical or similar to the elements 110, 120, and 130 described in FIG. 3. Although three elements 221, 222, and 223 are illustrated within gap 242 in FIG. 5, more or fewer than three elements could be used.

Further, elements 221, 222, and 223 may be oriented in any suitable manner within gap 242. The orientation of elements 221, 222, and 223 may be identical or similar to the orientation of the elements 110, 120, and 130 described in FIG. 3. Elements 221, 222, and 223 may be arranged symmetrically or asymmetrically with respect to each other. For example, elements 221 and 223 are illustrated as asymmetrically arranged around element 222. Elements 221, 222, and 223 may be centered in the gap 242 between IC dice 202 and 203, but they need not be. In FIG. 5, elements 221, 222, and 223 are illustrated as off-center in gap 242.

One or more elements, such as elements 231, 232, and 233, are located in the gap 243 between IC dice 203 and 204. Elements 231, 232, and 233 may be identical or similar to the elements 110, 120, and 130 described in FIG. 3. Although three elements 231, 232, and 233 are illustrated within gap 243 in FIG. 5, more or fewer than three elements could be used. In an embodiment, elements 231, 232, and 233 may be separated by unequal distances.

Further, elements 231, 232, and 233 may be oriented in any suitable manner within gap 243. The orientation of elements 231, 232, and 233 may be identical or similar to the orientation of the elements 110, 120, and 130 described in FIG. 3.

Although the embodiment shown in FIG. 5 has been described with reference to four IC dice 201-204, embodiments of the subject matter are not limited to only four IC dice, and they may be used for controlling underfill distribution underneath fewer or more than four IC dice.

Figure 6:
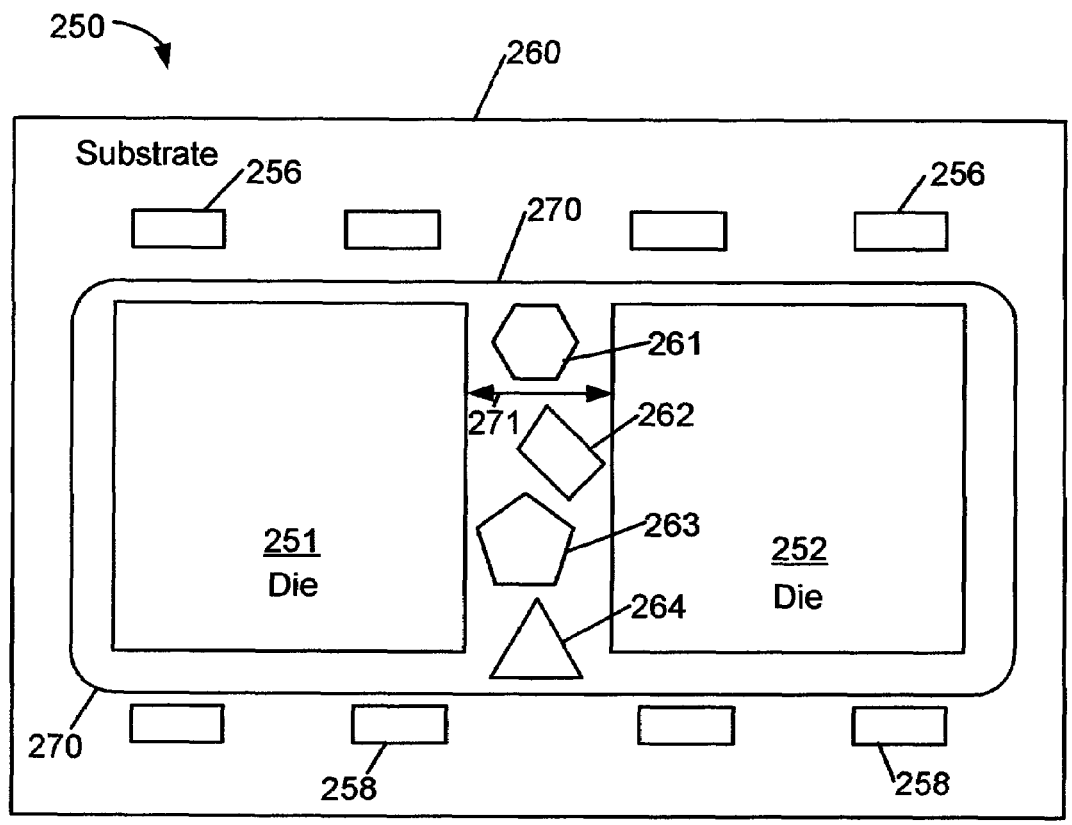
FIG. 6 illustrates a top view representation of a controlled underfill distribution IC package, in accordance with another embodiment of the invention.

FIG. 6 illustrates a top view representation of a controlled underfill distribution IC package 250, in accordance with another embodiment of the invention. IC package 250 includes two IC dice 251 and 252 arranged on a substrate 260. Substrate 260 may be identical or similar to the substrate 101 described in FIG. 3.

IC dice 251 and 252 may be identical or similar to the IC dice 102 and 104 described in FIG. 3.

IC dice 251 and 252 are separated by gap 271. Gap 271 may be identical or similar to the gap 114 described in FIG. 3.

A suitable underfill material 270 surrounds the connections (not shown) in the region underneath IC dice 251 and 252, between the IC dice 251 and 252 and the substrate 260. The underfill material 240 may be identical or similar to the underfill material 112 described in FIG. 3.

In an embodiment, one or more elements 256 and 258 may be coupled to substrate 260. Elements 256 and 258 may be identical or similar to the elements 108 described in FIG. 3.

One or more elements, such as elements 261-264, are located in the gap 271 between IC dice 251 and 252. Elements 261-264 may be identical or similar to the elements 110, 120, and 120 described in FIG. 3. Although four elements 261-264 are illustrated in FIG. 6, more or fewer than four elements could be used.

Elements 261-264 may be of any suitable shape. For example, element 261 is illustrated as having six sides of approximately equal length. Element 262 is illustrated as having four sides, one or more of which differ in length from the others. Element 263 is illustrated as having five sides of approximately equal length. Element 264 is illustrated as having three sides of approximately equal length. Although elements 261-264 are shown as varying in dimensions and shapes, in an embodiment, they may be of substantially identical dimensions and shapes.

Although the embodiment shown in FIG. 6 has been described with reference to two IC dice 251 and 252, embodiments of the subject matter are not limited to only two IC dice, and they may be used for controlling underfill distribution under more than two IC dice.

Figure 7:
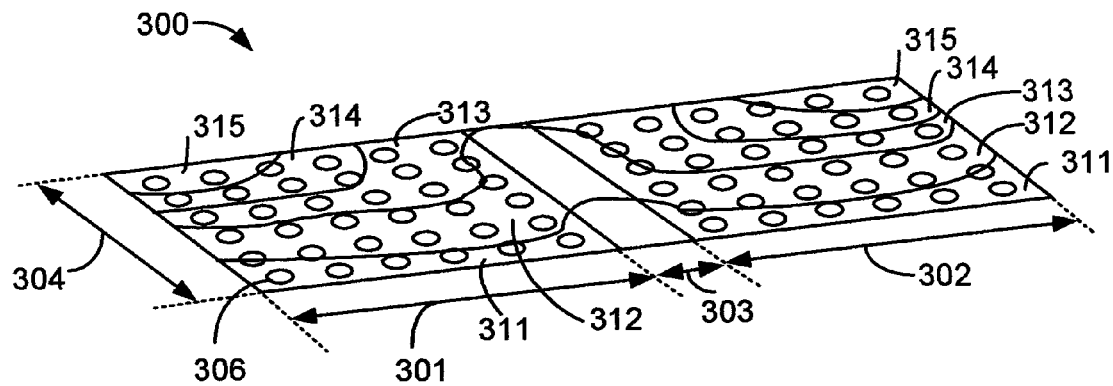
FIG. 7 shows a computer simulation of underfill concentration after its application to a prior art dual-dice IC package.

FIG. 7 shows a computer simulation of underfill concentration after its application to a prior art dual-dice IC package 300. The footprints of two IC dice (not shown) each having an X-dimension 301 and 302, respectively, and a Y-dimension 304 are separated by a gap of dimension 303. The sites 306 of a plurality of connections, such as solder bumps, can also be seen. Prior art IC package 300 does not have any elements located within the gap 303 between the two die-attach areas to control the application of underfill material.

For the purposes of this illustration, it is assumed that underfill material has been previously dispensed along the bottom edge of the length of prior art IC package 300. The flow concentration of underfill is represented by the contoured regions 311, 312, 313, 314, and 315. The regions 311-315 are situated underneath the dice (not shown), between the dice and the substrate (not shown).

Regions 311 have the highest concentration of underfill, while regions 315 have the lowest. As underfill is dispensed along the bottom edge of the prior art IC package 300, it typically moves under and between the dice through capillary action. Its concentration gradually decreases as it moves through regions 311-315. Due to the absence of any element(s) in gap 303 to control the underfill application, the underfill material flows relatively fast between the dice, and the underfill material flows relatively slowly and in relatively less quantity out to the regions 315 at the northwest and northeast corners of the prior art IC package 300. Underfill voids (not shown) are most likely to occur in the regions 315 with the lowest underfill concentration.

As a result of the increased potential for the formation of voids in the prior art IC package 300, the dice cannot be separated beyond a point where the flow of underfill is adversely impacted. However, it may be important to separate dice further than this point in order to facilitate packaging, including electrical routing and interconnection as well as assembly operations.

Figure 8:
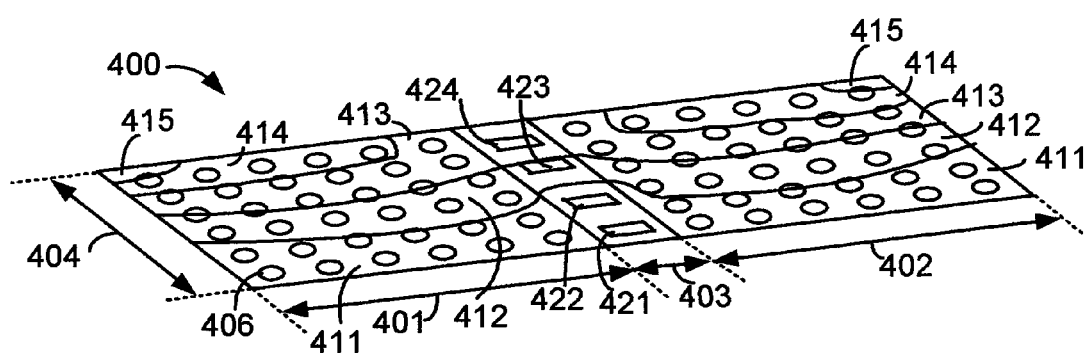
FIG. 8 shows a computer simulation of underfill concentration after its application to a controlled underfill distribution multiple-dice IC package, in accordance with an embodiment of the subject matter.

FIG. 8 shows a computer simulation of underfill concentration after its application to a controlled underfill distribution multiple-dice IC package 400, in accordance with an embodiment of the subject matter. The footprints of two IC dice (not shown) each having an X-dimension 401 and 402, respectively, and a Y-dimension 404 are separated by a gap of dimension 403. The sites 406 of a plurality of connections, such as solder bumps, can also be seen.

The footprints of one or more elements 421-424 are located in the gap 403 to control the flow of underfill as it is applied.

For the purposes of this drawing, it is assumed that underfill material has been dispensed along the bottom edge of the length of IC package 400. The flow concentration of underfill is represented by the contoured regions 411, 412, 413, 414, and 415. The regions 411-415 are situated underneath the dice (not shown), between the dice and the substrate (not shown).

Regions 411 have the highest concentration of underfill, while regions 415 have the lowest. As underfill is dispensed along the bottom edge of the IC package 400, its concentration gradually decreases as it moves through regions 411-415.

Due to the presence of one or more elements 421-424 in the gap 403 to control the flow of underfill, the underfill material encounters some flow resistance and moves relatively more slowly through gap 403 than if the one or more elements 421-424 were not present. A relatively larger amount of the underfill material flows relatively further out to the regions 415 at the northwest and northeast corners of the IC package 400.

As a result, regions 415 of low underfill concentration are smaller, in comparison with regions 315 produced through computer-modeling of a prior art dual-dice IC package 300, and the potential for voids to occur is reduced.

FIG. 9 shows a cross-sectional view taken along line 132 of FIG. 3.

As described earlier with reference to FIG. 3, IC package 100 includes a substrate 101 upon which may be mounted a first IC 102 and a second IC 104.

In an embodiment, substrate 101 has a thickness A, which may range from approximately 1.0 millimeters ("mm") to 1.4 mm.

IC dice 102 and 104 may be coupled to the substrate 101 by solder balls 106. IC dice 102 and 104 have a thickness D, which may range from approximately 0.75 mm. to approximately 0.85 mm. in an embodiment. In an embodiment, thickness D of IC dice 102 and 104 is approximately 0.79 mm. The thickness D of each IC die 102, 104 may be different.

The upper surfaces of IC dice 102 and 104 are above the surface of the substrate 101 by height C, which is approximately equal to the thickness of an IC dice 102 or 104 plus the thickness of the solder balls 106. Although FIG. 9 shows IC dice 102 and 104 as having approximately identical heights C, the height C may be different on each IC die 102, 104 in an embodiment.

Element 110 is coupled to substrate 101 in the gap between IC dice 102 and 104. In FIG. 9, element 110 is shown to be oriented so that its width extends between opposing IC dice 102 and 104. However, as described in FIG. 3, element 110 may be oriented so that its length extends between opposing IC dice 102 and 104. Multiple elements, such as element 110 (or elements 120 and 130, as seen in FIG. 3), may be located in gap 114. In an embodiment, each element 110 may have a unique orientation.

Element 110 is coupled to substrate 101 by solder connection 111. A relatively thin layer of underfill 112 may lie between element 110 and the upper surface of substrate 101.

The top of element 110 has a height B above the surface of substrate 101. Height B may range from approximately 0.4 mm. to 0.7 mm. In an embodiment, height B may be approximately 0.55 mm. In an embodiment, height B may range from approximately 5% to 95% of height C. In another embodiment, height B may range from approximately 50% to 75% of height C. In an embodiment, height B may be equal to approximately 60% of height C.

Underfill material 112 surrounds the connections 106 in the region underneath IC dice 102 and 104, between the IC dice 102 and 104 and the substrate 101. The underfill material 112 was described earlier with reference to FIG. 3.

The fabrication of an IC package having controlled underfill distribution between multiple IC dice and a substrate on which the IC dice are mounted will now be described.

Figure 10:
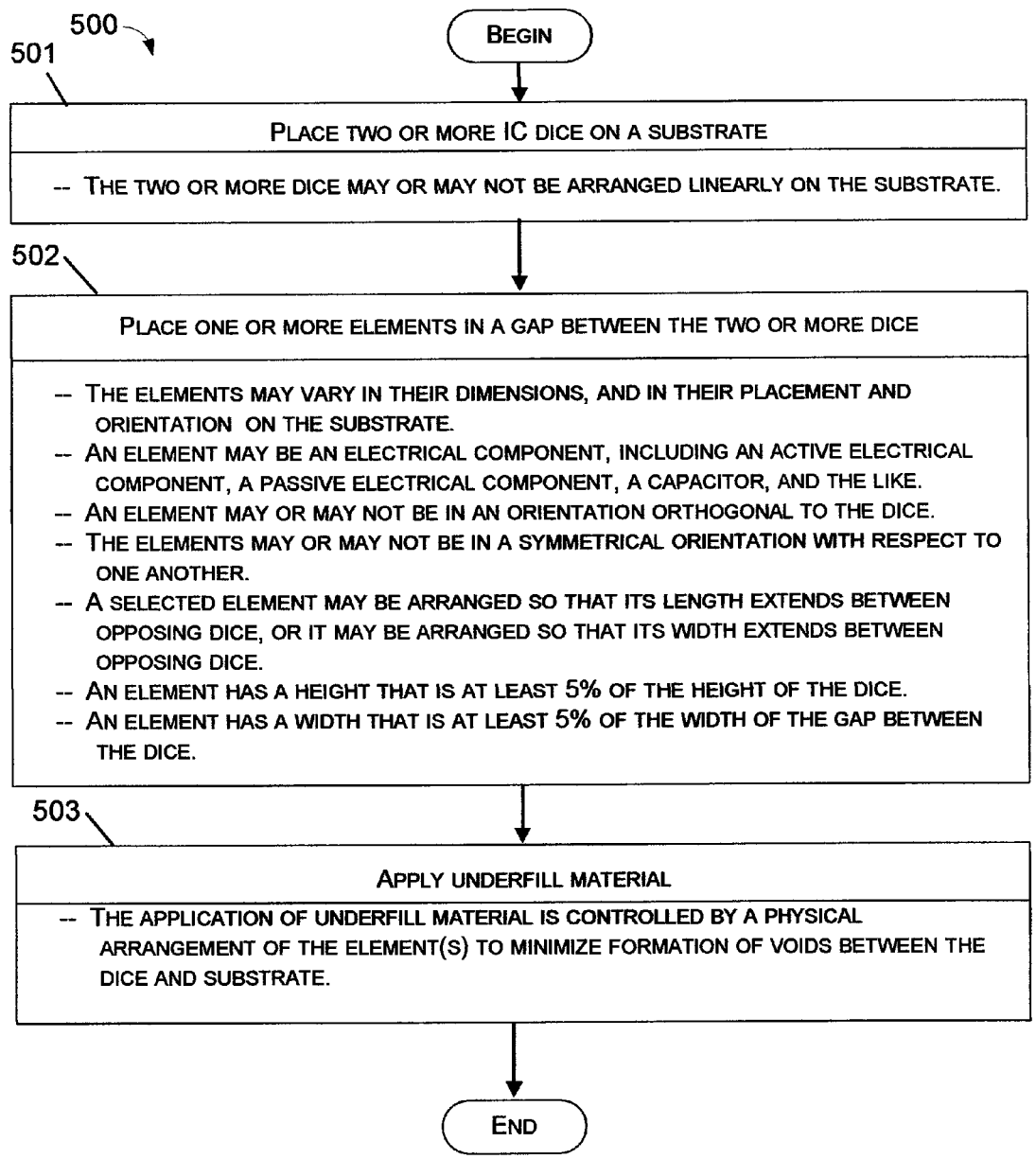
FIG. 10 is a flow diagram of several alternative methods of fabricating a controlled underfill distribution IC package, in accordance with various embodiments of the subject matter.

FIG. 10 is a flow diagram 500 of several alternative methods of fabricating a controlled underfill distribution IC package, in accordance with various embodiments of the subject matter.

In 501, two or more dice are placed on a substrate. The substrate may be an IC package substrate. Alternatively, it could be a PCB or other type of substrate. The substrate may comprise at least one dielectric layer (e.g. of organic or ceramic material). The substrate may also comprise at least one conductive layer having at least one conductive node or terminal, either on the surface of the substrate or internally within the substrate. In an embodiment, the substrate may comprise a large number of signal, power, and ground nodes.

Still referring to 501, in an embodiment, the two or more dice may or may not be arranged linearly on the substrate. The dice may have a plurality of mounting contacts or terminals, which may also be referred to as "bumps", "balls", or "pads". The contacts may be formed of any suitable material, such as solder.

In 502, one or more elements are placed in a gap or region between the two or more dice. The elements may vary in their dimensions, as well as in their placement and orientation on the substrate.

The one or more elements may be electrical components, including active electrical components, passive electrical components, and/or dummy non-functional elements.

The one or more elements may or may not be in an orientation orthogonal to the dice. Elements that are orthogonal to the dice may be seen, for example, in elements 110, 120, and 130 of FIG. 3. Elements that are not orthogonal to the dice may be seen, for example, in elements 262-264 in FIG. 6.

The elements may or may not be in a symmetrical orientation with respect to one another. Elements that are in a symmetrical orientation with respect to one another may be seen, for example, in elements 231-233. Elements that are not in a symmetrical relationship with respect to one another may be seen, for example, in elements 221-223 in FIG. 5.

A selected element may be arranged so that its length extends between opposing dice, or it may be arranged so that its width extends between opposing dice. An example of the former orientation may be seen, for example, in element 120 in FIG. 3, whereas an example of the latter orientation may be seen, for example, in element 130 in FIG. 3.

The one or more elements have a height that is at least 5% of the height of the dice. They have a width that is at least 5% of the width of the gap between the dice. In an embodiment, the elements are passive electrical components, e.g. capacitors, having a height at least 5% of the height of the dice and a width at least 5% of the gap width. Other embodiments, in which the one or more elements have different possible heights relative to the height of a die, were discussed earlier with regard to FIG. 3.

The conductive bumps or balls may be formed of any suitable conductive material. For example, they may be formed of material selected from the group consisting essentially of antimony, bismuth, copper, gallium, gold, indium, lead, nickel, silver, tin, zinc, or alloys thereof. In an embodiment, the bumps may be lead-free. In another embodiment, the bumps may be lead-bearing.

The operations described above with respect to the methods illustrated in FIG. 10 may be performed in a different order from those described herein. Although the flow diagram of FIG. 10 shows an "End", it may be performed continuously if desired.

The above-described choice of materials; geometry; number, order, dimensions, and composition of structural elements; fabrication operations; and assembly sequencing may all be varied by one of ordinary skill in the art to achieve the advantages of the inventive subject matter, depending upon the requirements of the electronic assembly of which it forms a part.

Any suitable method, or combination of different methods, for performing the operations of FIG. 10 may be used.

FIG. 11 shows a cross-sectional view taken along line 134 of FIG. 3 of an IC package comprising an element 130 that has a lower height above the upper surface of the substrate than that of element 110 in FIG. 9.

FIGS. 1-9 are merely representational and are not drawn to scale. Certain proportions thereof may be exaggerated, while others may be minimized. FIGS. 1-11 are intended to illustrate various embodiments of the subject matter that can be understood and appropriately carried out by those of ordinary skill in the art.

The inventive subject matter provides for an electronic package, such as an IC package, an electronic assembly, and methods of manufacture thereof that may minimize underfill problems associated with high-performance, multiple-dice electronic packages. Otherwise, the electronic package may experience reliability problems, and the associated electronic assembly may malfunction or even experience a catastrophic failure.

Other embodiments will be readily apparent to those of ordinary skill in the art after reading this disclosure.

While certain operations have been described herein relative to "upper" and "lower" surfaces, it will be understood that these descriptors are relative, and that they would be reversed if the IC package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

It is emphasized that the Abstract is provided to comply with 37 C.F.R. §1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An integrated circuit package comprising:
   a substrate having a plurality of dice on a surface thereof, the dice being separated by a gap, and the dice having a height;
   one or more elements in the gap between the dice, wherein the one or more elements have a height that is at least 5% of the height of the dice; and
   an underfill material covering the dice and the one or more elements;
   wherein the gap is greater than a gap for which an application of the underfill from one edge of the integrated circuit package would increase a potential to form underfill voids in portions of the dice furthest from the edge in the absence of the one or more elements.

2. The package recited in claim 1, wherein the one or more elements comprise active or passive electrical components.

3. The package recited in claim 2, wherein the electrical components comprise capacitors.

4. The package recited in claim 1, wherein the one or more elements are in an orientation orthogonal to the dice.

5. The package recited in claim 1, wherein the one or more elements are in a symmetrical orientation with respect to one another.

6. The package recited in claim 1, wherein a selected element has a length and a width;

wherein two opposing dice are arranged on either side of the gap; and wherein the selected element is oriented in the gap so that its length extends between the opposing dice.

7. The package recited in claim 1, wherein a selected element has a length and a width;

wherein two opposing dice are arranged on either side of the gap; and wherein the selected element is oriented in the gap so that its width extends between the opposing dice.

8. The package recited in claim 1, wherein the one or more elements have different heights.

9. The package recited in claim 1, wherein two or more dice are linearly arranged on the substrate.

10. An electronic system comprising:

a bus coupling components in the electronic system;

a display coupled to the bus;

external memory coupled to the bus; and a processor coupled to the bus and having an electronic assembly including at least one component package having a substrate having a plurality of dice on a surface thereof, the dice being separated by a gap having a width;

one or more elements in the gap between the dice, wherein the elements have a width that is at least 5% of the gap width; and a congealed material surrounding the dice and elements;

wherein the gap is greater than a gap for which an application of the underfill from one edge of the integrated circuit package would increase a potential to form underfill voids in portions of the dice furthest from the edge in the absence of the one or more elements.

11. The system recited in claim 10, wherein the one or more elements comprise active or passive electrical components.

12. The system recited in claim 11, wherein the electrical components comprise capacitors.

13. The system recited in claim 10, wherein the one or more elements are in an orientation orthogonal to the dice.

14. The system recited in claim 10, wherein the one or more elements are in a symmetrical orientation with respect to one another.

15. The system recited in claim 10, wherein a selected element has a length and a width;

wherein two opposing dice are arranged on either side of the gap; and wherein the selected element is oriented in the gap so that its length extends between the opposing dice.

16. The system recited in claim 10, wherein a selected element has a length and a width;

wherein two opposing dice are arranged on either side of the gap; and wherein the selected element is oriented in the gap so that its width extends between the opposing dice.

17. The system recited in claim 10, wherein the one or more elements have different heights.

18. The system recited in claim 10, wherein two or more dice are linearly arranged on the substrate.

* * * * *